United States Patent [19]
Orisaka et al.

[11] Patent Number: 5,440,272
[45] Date of Patent: Aug. 8, 1995

[54] DIFFERENTIAL AMPLIFIER

[75] Inventors: Yukihisa Orisaka, Tenri; Junji Tanaka, Sakurai, both of Japan

[73] Assignee: Sharp Kabushiki Kaisha, Osaka, Japan

[21] Appl. No.: 158,985

[22] Filed: Nov. 30, 1993

[30] Foreign Application Priority Data
Nov. 30, 1992 [JP] Japan ................................. 4-320108
Aug. 31, 1993 [JP] Japan ................................. 5-216693

[51] Int. Cl.⁶ .............................................. H03F 3/45
[52] U.S. Cl. ................................................. 330/253
[58] Field of Search ........................................ 330/253

[56]  References Cited
U.S. PATENT DOCUMENTS
4,379,267  4/1983  Young ................................. 330/253
4,885,477  12/1989  Bird et al. ....................... 330/253 X FOREIGN PATENT DOCUMENTS
61-225911  10/1986  Japan .

Primary Examiner—James B. Mullins

[57] ABSTRACT

A differential amplifier includes a noninverting input transistor including a gate for receiving a first input signal; and an inverting input transistor including a gate for receiving a second input signal. A difference between the first input signal and the second input signal is amplified. The noninverting input transistor and the inverting input transistor are each formed of a depletion MOSFET.

19 Claims, 5 Drawing Sheets

DIFFERENTIAL AMPLIFIER

BACKGROUND OF THE INVENTION

1. Field of the Invention

The present invention relates generally to differential amplifiers. More particularly, the present invention relates to a differential amplifier used, for example, in an input circuit of an operational amplifier or an output circuit of a driving circuit of a display device such as a liquid crystal display device.

2. Description of the Related Art

A differential amplifier is used in an input circuit of an operational amplifier. The input circuit includes a noninverting input stage and an inverting input stage. A differential amplifier itself can be an operational amplifier. A differential amplifier is also used for an output circuit of a driving circuit of a display device such as a liquid crystal display device. In such a case, a voltage follower having a high input impedance and low output impedance is formed by negative feedback of an output from the differential amplifier into an inverting input stage. Some of such differential amplifiers include an output buffer for outputting a differential output from the differential amplifier through an output transistor. The output transistor is formed as a source follower or as an emitter follower in the case where a bipolar transistor is used as the output transistor.

FIG. 7 is a circuit diagram showing a prior art differential amplifier using MOSFETs (metal-oxide-semiconductor field effect transistors). In FIG. 7, the differential amplifier includes transistors N1 to N3 each formed of an enhancement-type n-channel MOSFET and transistors P4 and P5 each formed of an enhancement-type p-channel MOSFET. The transistors N1 and N2 are configured as a differential pair. Specifically, the transistor N1 is an input transistor having a gate supplied with an input voltage $V_{IN+}$ representing a noninverting input stage, and the transistor N2 is an input transistor having a gate supplied with an input voltage $V_{IN-}$ representing an inverting input stage. The transistor N3 has a gate supplied with a bias voltage $V_b$ for producing a constant current, thereby forming a constant current circuit. The transistors P4 and P5 form a current mirror circuit.

In a differential amplifier such as that shown in FIG. 7, when the gates of the transistors N1 and N2 are supplied with input voltages $V_{IN+}$ and $V_{IN-}$, respectively, the transistors N1 and N2 become active. The constant current circuit formed by the transistor N3 and the current mirror circuit formed by the transistors P4 and P5 are balanced with each other, and thus a difference voltage between the input voltages $V_{IN+}$ and $V_{IN-}$ is amplified and outputted as an output voltage $V_{OUT}$.

The transistors N1 and N2, which are each formed of an enhancement MOSFET, turn off when the input voltages $V_{IN+}$ and $V_{IN-}$ are respectively reduced to levels lower than the threshold voltages of the transistors N1 and N2. FIG. 9 illustrates the relationship between the input voltage $V_{IN+}$ and the output voltage $V_{OUT}$ when the input voltage $V_{IN-}$ is 0 volts (V). As is shown, when the input voltage $V_{IN+}$ is lower than the threshold voltage of the transistor N1, the output voltage $V_{OUT}$ remains fixed at 0 volts.

As a result, the lowest level of the output voltage $V_{OUT}$ which can be obtained from the input voltages $V_{IN+}$ and $V_{IN-}$ is limited by the threshold voltage of the enhancement MOSFET, e.g., N1, thereby narrowing the dynamic range of the differential amplifier.

FIG. 8 is a circuit diagram of another prior art differential amplifier. In FIG. 8, the differential amplifier includes a differential amplifying section 1 which is identical to the differential amplifier shown in FIG. 7. In addition, the differential amplifier includes an output buffer section 2. The output buffer section 2 includes transistors N6 and N7 each formed of an enhancement-type n-channel MOSFET. The transistor N7 has a gate supplied with a bias voltage $V_{b0}$ for providing a constant current, thereby forming a constant current circuit. The transistor N6 has a source connected to a drain of the transistor N7, thereby forming a source follower and acts an output transistor.

The differential amplifier shown in FIG. 8 has associated therewith another problem in addition to the one described above with respect to FIGS. 7 and 9. The transistor N6 used as the source follower is formed of an enhancement-type MOSFET. Accordingly, the voltage applied between the gate and the source of the transistor N6 cannot be lower than the threshold voltage thereof. Thus, the highest amplitude level of the output voltage $V_{OUT}$ provided at the source of the transistor N6 is limited to a level which is lower than the voltage of a power source $V_{DD}$ by the threshold voltage of transistor N6, thereby narrowing the dynamic range.

Japanese Laid-Open Patent Publication No. 61-225911 discloses a system for improving dynamic range by further lowering the lowest obtainable output voltage. Specifically, the reference discloses applying a specified bias voltage to the substrate of two transistors of a differential amplifier. In such a system, the level of the bias voltage which can be applied is restricted by a parasitic diode which is generated between the substrate and the well area. Accordingly, the lowest limit is not sufficiently lowered. Further, a separate power supply is required for applying the bias voltage to the substrate, thus undesirably increasing the number of peripheral components.

SUMMARY OF THE INVENTION

The differential amplifier of this invention includes: a noninverting input transistor including a gate for receiving a first input signal; an inverting input transistor including a gate for receiving a second input signal; the noninverting input transistor and inverting input transistor being configured whereby a difference between the first input signal and the second input signal is amplified; and wherein the noninverting input transistor and the inverting input transistor are each formed of a depletion-type MOSFET.

Another aspect of the invention, the differential amplifier includes: a noninverting MOSFET transistor and an inverting MOSFET transistor configured as a differential pair for producing an output voltage as a function of respective input signals applied to the noninverting MOSFET transistor and the inverting MOSFET transistor; and wherein the noninverting MOSFET transistor and the inverting MOSFET transistor are depletion-type MOSFETs.

Thus, the invention described herein provides a differential amplifier having a wider dynamic range as compared to conventional differential amplifiers.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of examples with reference to the accompanying drawings.

EXAMPLE 1

Figure 1:
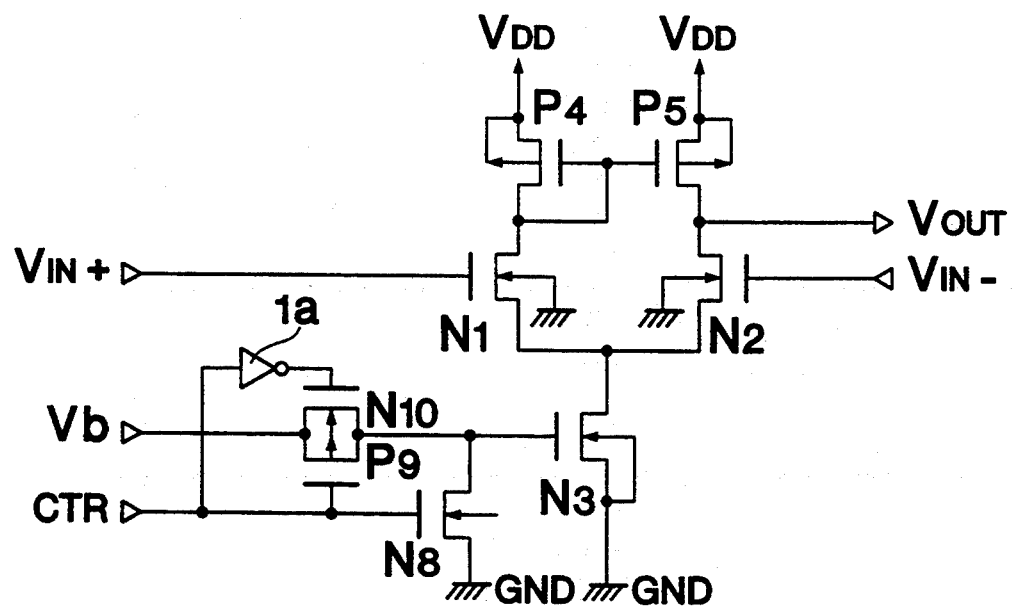
FIG. 1 is a circuit diagram of a differential amplifier in a first example according to the present invention.
Figure 2:
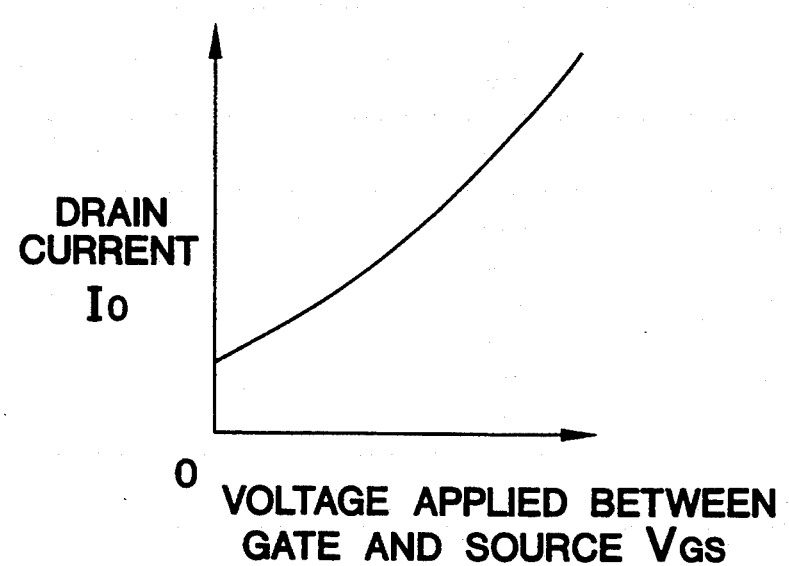
FIG. 2 is a graph illustrating the relationship between the drain current and the voltage applied between a gate and a source of a depletion-type n-channel MOSFET used in the differential amplifier of FIG. 1 according to the present invention.
Figure 3:
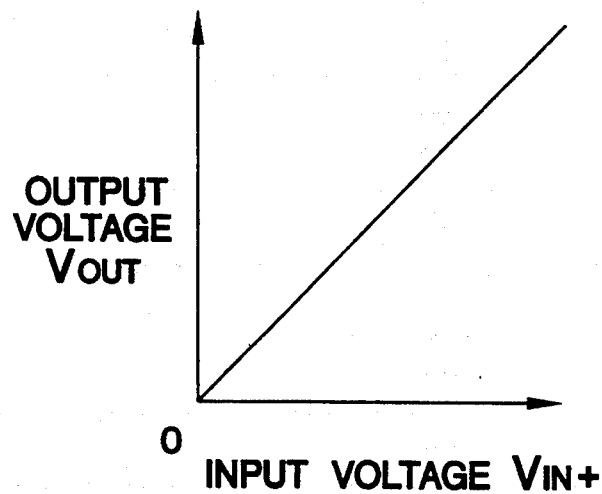
FIG. 3 is a graph illustrating the relationship between the input voltage and the output voltage of the differential amplifier of FIG. 1 according to the present invention.
Figure 7:
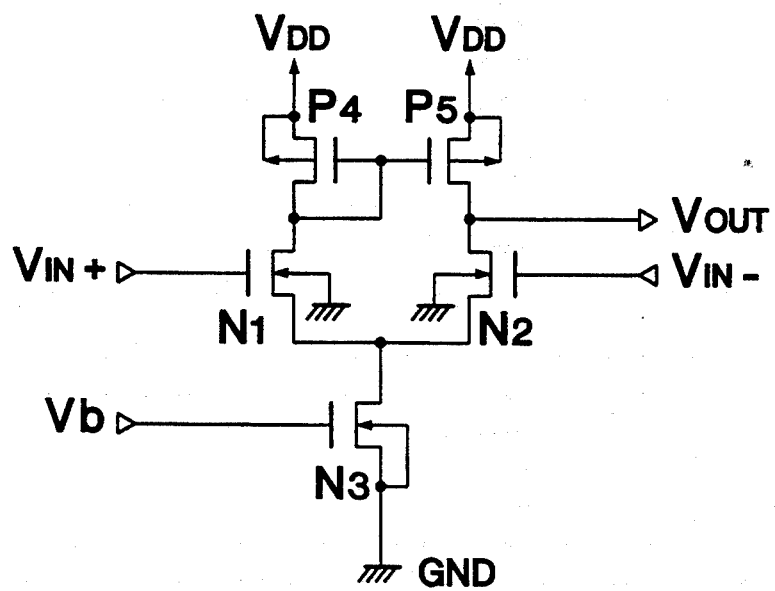
FIG. 7 is a circuit diagram of a conventional differential amplifier.

FIG. 1 is a circuit diagram of a differential amplifier in a first example according to the present invention. FIG. 2 illustrates the relationship between the drain current and the voltage applied between a gate and a source of a depletion-type n-channel MOSFET used in the differential amplifier in FIG. 1. FIG. 3 illustrates the relationship between the input voltage and the output voltage of the differential amplifier in FIG. 1. Identical elements with those in FIG. 7 bear identical reference numerals therewith except as otherwise included.

As is shown in FIG. 1, a differential amplifier includes transistors N1 to N3, N8 and N10 each formed of an n-channel MOSFET, and transistors P4, P5 and P9 each formed of a p-channel MOSFET.

The transistors N1 and N2 are configured as a differential pair. Specifically, the transistor N1 is an input transistor having a gate supplied with an input voltage $V_{IN+}$ representing the noninverting input stage; and the transistor N2 is an input transistor having a gate supplied with an input voltage $V_{IN-}$ representing the inverting input stage. The transistors N1 and N2 are each formed of a depletion-type MOSFET.

In a depletion-type MOSFET, as is represented in FIG. 2, even when the voltage $V_{GS}$ applied between the gate and source of the MOSFET is 0 V, a drain current $I_D$ flows to make the MOSFET active. In the case where such a depletion-type MOSFET is used for the transistors N1 and N2, the input voltage $V_{IN+}$ and the output voltage $V_{OUT}$ have the relationship as is shown in FIG. 3 when, for example, the input voltage $V_{IN-}$ is 0 V. That is, even if the input voltage $V_{IN+}$ is reduced to 0 V, a corresponding output voltage $V_{OUT}$ can be obtained.

The transistor N3 has a gate supplied with a bias voltage $V_b$ for obtaining the constant current through a bias voltage switching circuit, thereby forming a constant current circuit. Such a constant current circuit has a high impedance with respect to signals, and thus forms a high impedance circuit forming a source resistance common to both the transistors N1 and N2.

The bias voltage switching circuit includes the transistors N8, P9, N10 and an inverter 1a. The transistors P9 and N10 form an analog switch. Specifically, the source of transistors P9 and N10, respectively, are both connected to the bias voltage $V_b$. The drain of transistors P9 and N10, respectively, are connected together to the gate of transistor N3. The drain of transistor N8 is also connected to the gate of transistor N3, and the source of both transistors is connected to a power source GND. A bias voltage switching signal CTR is connected to the input of the inverter 1a and to the gate of transistors N8 and P9. The output of the inverter 1a is connected to the gate of transistor N10.

When the bias voltage switching signal CTR is a logic "0" (e.g., a voltage on the level of power source GND), the transistor P9 and the transistor N10 connected to the transistor P9 through the inverter 1a are both turned on. As a result, the bias voltage $V_b$ is applied to the gate of the transistor N3. At the same time, the bias voltage switching signal CTR is also inputted to the gate of the transistor N8. When the bias voltage switching signal CTR is a logic "1" (e.g., a voltage on the level of the voltage of a power source $V_{DD}$), the transistor N8 turns on while the analog switch formed by transistors P9 and N10 turns off. As a result, voltage of the gate of the transistor N3 is reduced to the level of the voltage of a power source GND, thereby turning off the transistor N3. The transistors P4 and P5 form a current mirror circuit. The transistors N3, P4, P5, N8, P9 and N10 are all formed of enhancement-type MOSFETs.

In the above-mentioned differential amplifier, a difference between input voltages $V_{IN+}$ and $V_{IN-}$ is amplified and outputted as an output voltage $V_{OUT}$ at the drain of transistor N2. For example, when the input voltage $V_{IN+}$ at the noninverting input stage is higher than the input voltage $V_{IN-}$ of the inverting input stage, the drain voltage of the transistor N2 is increased and thus the output voltage $V_{OUT}$ is also raised. By contrast, when the input voltage $V_{IN-}$ at the inverting input stage is higher than the input voltage $V_{IN+}$ of the noninverting stage, the drain voltage of the transistor N2 is decreased and thus the output voltage $V_{OUT}$ is also reduced. Even when the output voltages $V_{IN+}$ and $V_{IN-}$ are at a threshold voltage of the enhancement-type MOSFETs or lower, the depletion-type transistors N1 and N2 are turned active. Accordingly, differential amplification is properly performed. Thus, the lowest level of the amplitude of the output voltage $V_{OUT}$ is lowered, thereby extending the dynamic range.

The transistors N1 and N2 are turned active even when the input voltages $V_{IN+}$ and $V_{IN-}$ are 0 V, respectively. Accordingly, a through-current constantly flows from the power source $V_{DD}$ to the power source GND, thereby increasing the power consumption. In this example, in order to prevent such an inconvenience, a control circuit (not shown) is provided so that the bias voltage switching signal CTR is a voltage on the level of the voltage of the power source GND when the differential amplifier is operated. On the other hand, the bias voltage switching signal CTR is a voltage on the level of the voltage of the power source $V_{DD}$ when the differential amplifier is not operated. Due to such control, when the differential amplifier is operated, the transistor N8 is turned off and the analog switch formed of the transistors P9 and N10 is turned on. Thus, the transistor N3 forming the constant current circuit is supplied with a bias voltage at the gate thereof, thereby performing normal constant current operation. When the differential amplifier is not operated, the analog switch is turned off, and the transistor N8 is turned on, thereby turning off the transistor N3. Thus, the through-current is eliminated.

In a differential amplifier according to this example, the lowest limit of the amplitude of the output voltage $V_{OUT}$ is lowered to extend the dynamic range, and also the through-current is eliminated to reduce the power consumption, by forming the transistors N1 and N2 each of a depletion-type MOSFET.

In the case where the transistor N3 forming the constant current circuit is formed of a depletion-type MOSFET, a constant drain current flows even if the gate of the transistor N3 is directly connected to the power source GND to make the voltage applied between the gate and source 0 V. For this reason, there is no necessity for preparing a separate bias voltage $V_b$. In such a case, however, it is required to form a channel of a depletion-type MOSFET so that a desirable constant current flows when the voltage applied between the gate and the source is 0 V. Further, in order to turn off the transistor N3 when the differential amplifier is not operated, a separate bias voltage for applying a negative voltage to the transistor N3 is preferably provided.

EXAMPLE 2

Figure 4:
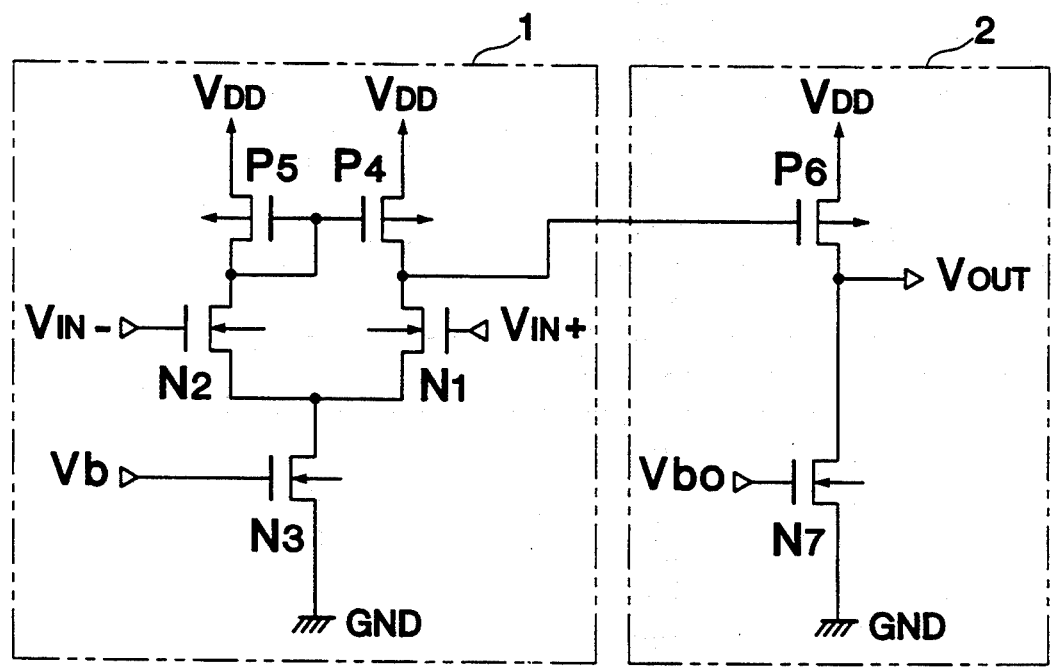
FIG. 4 is a circuit diagram of a differential amplifier in a second example according to the present invention.
Figure 8:
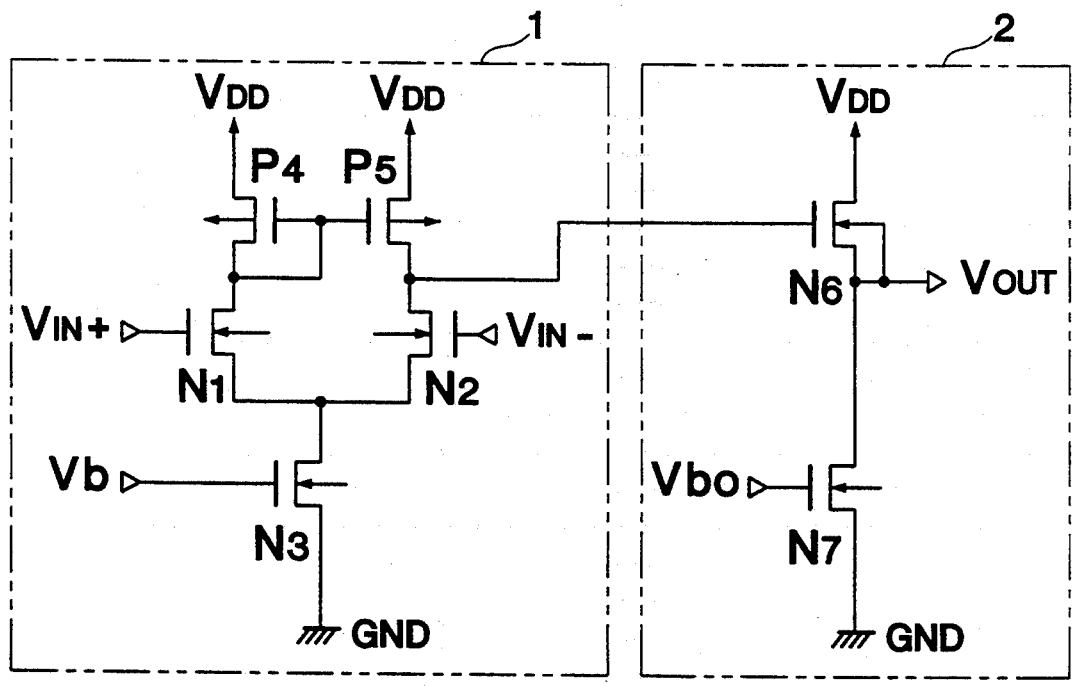
FIG. 8 is a circuit diagram of another prior art differential amplifier.
Figure 9:
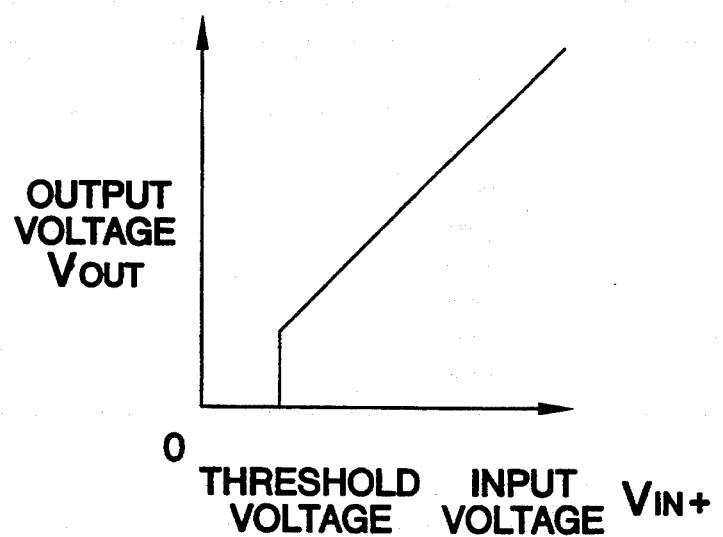
FIG. 9 is a prior art graph illustrating the relationship between the input voltage and the output voltage of the differential amplifier shown in FIG. 7.

FIG. 4 is a circuit diagram of a differential amplifier in a second example according to the present invention. Identical elements with those in FIGS. 1 and 8 bear identical reference numerals therewith except as otherwise indicated.

The differential amplifier shown in FIG. 4 includes a differential amplifying section 1 and an output buffer section 2. The differential amplifying section 1 includes transistors N1 to N3 each formed of an n-channel MOSFET and transistors P4 and P5 each formed of a p-channel MOSFET. The differential amplifying section 1 has a substantially identical structure with that of the differential amplifier shown in FIG. 1 except that the bias voltage $V_b$ is not switchable. A difference between the input voltages $V_{IN+}$ and $V_{IN-}$ is amplified in the differential amplifying section 1 as in the differential amplifier shown in FIG. 1. The transistors N1 and N2 are each formed of a depletion-type MOSFET. As a result, normal amplification is performed even if the input voltages $V_{IN+}$ and $V_{IN-}$ are at or below the threshold voltage of an enhancement-type MOSFET. In this example, the drain voltage of the transistor N2 of the inverting input stage is tied to the gate voltage of the current mirror circuit formed of the transistors P4 and P5, and the output of the differential amplifying section 1 is taken from the drain of the transistor N1 of the noninverting input stage. According to such a structure, when the input voltage $V_{IN+}$ of the noninverting input stage is higher than the input voltage $V_{IN-}$ of the inverting input stage, the output voltage of the differential amplifying section 1 is decreased.

The output buffer section 2 includes a transistor P6 formed of a p-channel MOSFET and a transistor N7 formed of an n-channel MOSFET. The transistor P6 is an output transistor having its gate connected to the output of the differential amplifying section 1, i.e., the drain of transistor N1. The source of transistor P6 is connected to the power source $V_{DD}$, and the drain thereof is connected to the power source GND through the transistor N7. The transistor N7 has a gate supplied with a bias voltage $V_{b0}$ for obtaining a constant current, thereby forming a constant current circuit. The drain voltage of the transistor P6 is the output $V_{OUT}$ of the output buffer section 2, namely, the output of the differential amplifier.

In the above-mentioned differential amplifier, when the differential output voltage of the differential amplifying section 1 is increased, the voltage applied between the source and the drain of the transistor P6 in the output buffer section 2 is increased and thus the output voltage $V_{OUT}$ is decreased. On the other hand, when the differential output voltage of the differential amplifying section 1 is decreased, the voltage applied between the source and the drain of the transistor P6 in the output buffer section 2 is decreased and thus the output voltage $V_{OUT}$ is increased. It should be noted that the relationship between the input voltages $V_{IN+}$ and $V_{IN-}$, and the output voltage $V_{OUT}$ is identical with that in the first example. In the output buffer section 2 is the second example, unlike in the conventional output buffer section 2 shown in FIG. 8, when the differential output of the differential amplifying section 1 is a voltage on the level of the voltage of the power source GND, the voltage between the source and the drain of transistor P6 is substantially equal to 0 V. As a result, a voltage substantially equal to the power source $V_{DD}$ is outputted as the output voltage $V_{OUT}$. Accordingly, the highest level of the amplitude of the output voltage is not limited as in the case of the differential amplifier shown in FIG. 8.

In a differential amplifier according to this example, the lowest level and the highest level of the amplitude of the output voltage $V_{OUT}$ is respectively lowered and raised relative to conventional differential amplifiers. Thus, the present invention is able to extend the dynamic range by forming each of the transistors N1 and N2 in the differential amplifying section 1 using a depletion-type MOSFET and forming the transistor P6 in the output buffer section 2 using a p-channel MOSFET.

As in the first example, in the case where the transistor N3 forming the constant current circuit of the differential amplifying section 1 and the transistor N7 of the output buffer section 2 are each formed of a depletion-type MOSFET, separate bias voltages $V_b$ and $V_{b0}$ are not required.

EXAMPLE 3

Figure 5:
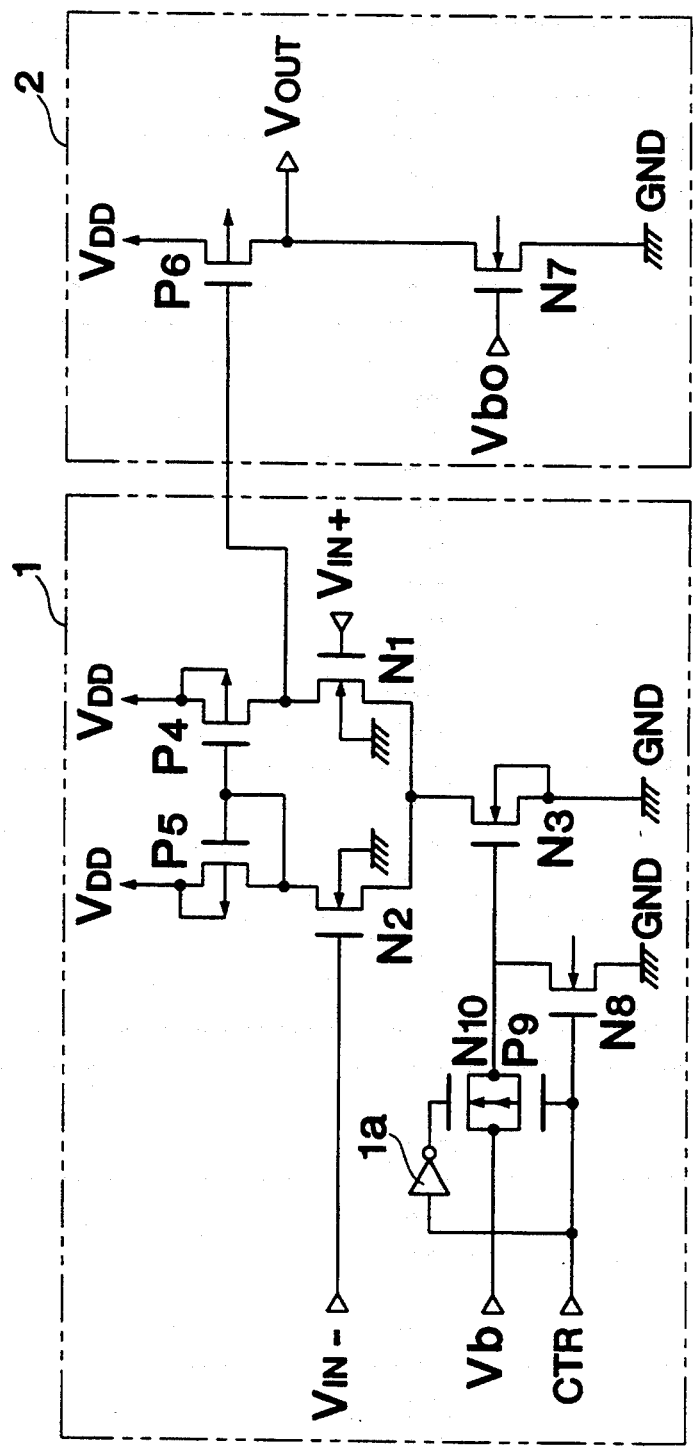
FIG. 5 is a circuit diagram of a differential amplifier in a third example according to the present invention.

FIG. 5 is a circuit diagram of a differential amplifier in a third example according to the present invention. Identical elements with those in FIGS. 1 and 4 bear identical reference numerals therewith except as otherwise indicated.

The differential amplifier in FIG. 5 also includes a differential amplifying section 1 and an output buffer section 2. The output buffer section 2 has an identical structure to that in the second example. In the differential amplifying section 1, the gate of the transistor N3 forming a constant current circuit is connected to a bias voltage switching circuit including the transistors N8, P9 and N10 and the inverter 1a as shown in FIG. 1.

The differential amplifying section 1 in the third example operates in the same manner as in the second example. As in the first example, however, when the differential amplifying section 1 is not operated, the bias voltage switching signal CTR is a logic "1" (e.g., a voltage on the level of the voltage of the power source $V_{DD}$). As a result, the analog switch including the transistors P9 and N10 is turned off, and the transistor N8 is turned on, thereby turning off the transistor N3. Thus, the through-current is eliminated.

In a differential amplifier in this example, the lowest level and the highest level of the amplitude of the output voltage $V_{OUT}$ is respectively lowered and raised so as to extend the dynamic range.

As in the second example, in the case where the transistor N3 in the differential amplifying section 1 and the transistor N7 in the output buffer section 2 are each formed of a depletion-type MOSFET, separate bias voltages $V_b$ and $V_{b0}$ are not required.

EXAMPLE 4

Figure 6:
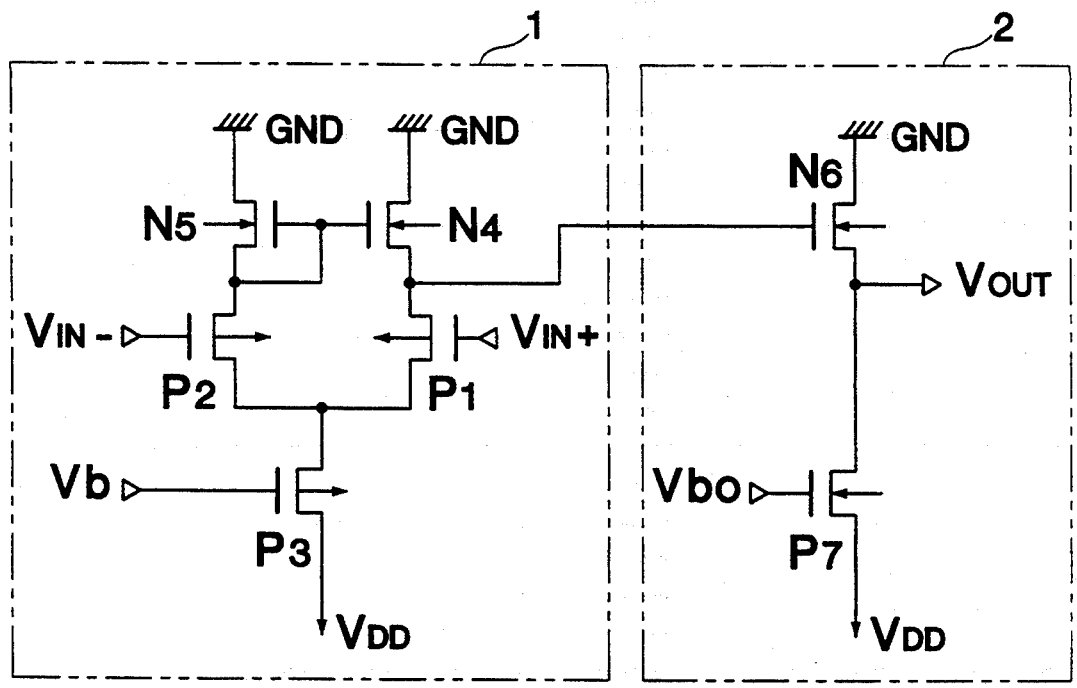
FIG. 6 is a circuit diagram of a differential amplifier in a fourth example according to the present invention.

FIG. 6 is a circuit diagram of a differential amplifier in a fourth example according to the present invention. Identical elements with those in FIG. 4 bear identical reference numerals therewith except as otherwise indicated.

In the example shown in FIG. 6, the opposite-channel MOSFETs are used as compared to those respectively shown in the second example. Practically, the differential amplifying section 1 includes transistors P1 to P3 each formed of a p-channel MOSFET and transistors N4 and N5 each formed of an n-channel MOSFET. The transistors P1 and P2 are configured in a differential pair with each acting as an input transistor; the transistor P3 forms a constant current circuit; and the transistors N4 and N5 form a current mirror circuit. The output buffer section 2 includes a transistor N6 formed of an n-channel MOSFET acting as an output transistor and a transistor P7 formed of a p-channel MOSFET acting as a constant current circuit. The power sources $V_{DD}$ and GND are arranged oppositely to those in the second example.

In the differential amplifier in the fourth example, the transistors P1 and P2 of the differential amplifying section 1 are each formed of a depletion-type MOSFET. Accordingly, even when the input voltages $V_{IN+}$ and $V_{IN-}$ are on the level of the voltage of the power source $V_{DD}$ (namely, when the voltage applied between the gate and the source of each of the transistors P1 and P2 is 0 V, which is lower than the threshold voltage thereof), the transistors P1 and P2 become active. Thus, the lowest level of the amplitude of the output voltage $V_{OUT}$ is lowered. As will be appreciated, in this example the lowest level refers to the voltage of the power source $V_{DD}$. As the output transistor in the output buffer section 2, the transistor N6 formed of an n-channel MOSFET is used as in the conventional differential amplifier. However, since the transistor N6 in the fourth example is not a source follower, but has the source thereof grounded, the highest level of the amplitude of the output voltage $V_{OUT}$ is raised. In this example, the highest level refers to the voltage of the power source GND. Thus, the dynamic range is extended as in the second example.

As will be appreciated, in the first and the third examples each of the transistors can be formed of an opposite-channel MOSFET. The same effects as described in the fourth example can be obtained.

According to the present invention, both of the transistors of the noninverting input stage and the inverting input stage are formed of a depletion-type MOSFET. Since the threshold voltage between the source and the gate has a negative value in a depletion-type MOSFET, the MOSFET is active even when the voltage applied between the source and the gate is 0 V. Accordingly, a differential amplifier of the present invention can perform differential amplification even using an input voltage lower than the threshold voltage of an enhancement MOSFET (which would turn off the input transistor in the conventional differential amplifier). As a result, the lowest level of the amplitude of the output voltage $V_{OUT}$ can be lowered to extend the dynamic range.

Further, when the differential amplifier is not operated, a bias voltage for obtaining a constant current is switched into a bias voltage for turning off the transistor forming the constant current circuit. Thus, generation of a through-current can be prevented in the depletion-type MOSFET when the differential amplifier is not used. If power consumption is not of concern, it is not necessary to switch off the through-current as will be appreciated.

In the case where the source of the output transistor in the output buffer section is grounded, the highest level of the amplitude of the output voltage from the drain can be raised to the level of the output voltage, thereby extending the dynamic range.

In the case where the transistor forming the constant current circuit and the transistor forming the output constant current circuit are each formed of a depletion-type MOSFET, an appropriate constant voltage can be supplied even when the voltage applied between the source and the gate of the transistor is 0 V. Therefore, a separate power source for supplying the bias voltage is not required.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A differential amplifier, comprising:
   a noninventing input transistor including a gate for receiving a first input signal;
   an inverting input transistor including a gate for receiving a second input signal; and
   a high impedance circuit connected to a source of the noninventing input transistor and a source of the inverting input transistor;
   said noninverting input transistor and said inverting input transistor being configured whereby a difference between the first input signal and the second input signal is amplified;
   wherein the noninverting input transistor and the inverting input transistor are each formed of a depletion-type MOSFET, and
   wherein the high impedance circuit includes a constant current transistor formed of a MOSFET in which a bias voltage is applied to a gate thereof and means for switching levels of said bias voltage applied to the gate of the constant current transistor so as to eliminate the through current, and
   wherein said means for switching includes:
   an inverter;
   a first transistor including a gate for receiving a bias voltage switching signal and a drain connected to the gate of the constant current transistor; and a second transistor and a third transistor forming an analog switch, drains of the second and third transistors being connected to the gate of the constant current transistor, sources of the second and third transistors receiving the bias voltage, a gate of the second transistor receiving the bias voltage switching signal, and a gate of the third transistor receiving the bias voltage switching signal through the inverter.

2. A differential amplifier according to claim 1, further comprising an output buffer section which includes:

an output transistor formed of a MOSFET having a gate connected to a drain of one of the noninverting input transistor and the inverting input transistor and a source connected to a first power source; and an output constant current transistor formed of a MOSFET having a drain connected to a drain of the output transistor, a source connected to a second power source, and a gate supplied with a constant bias voltage.

3. A differential amplifier according to claim 2, wherein the output constant current transistor is formed of a depletion-type MOSFET.

4. A differential amplifier according to claim 1, wherein the constant current transistor is of a depletion type.

5. A differential amplifier according to claim 4, further comprising an output buffer section which includes:

an output transistor formed of a MOSFET having a gate connected to a drain of one of the noninverting input transistor and the inverting input transistor and a source connected to a first power source; and an output constant current transistor formed of a MOSFET having a drain connected to a drain of the output transistor, a source connected to a second power source, and a gate supplied with a constant bias voltage.

6. A differential amplifier according to claim 5, wherein the output constant current transistor is formed of a depletion-type MOSFET.

7. A differential amplifier, comprising:

a noninverting MOSFET transistor and an inverting MOSFET transistor configured as a differential pair for producing an output voltage as a function of respective input signals applied to said noninverting MOSFET transistor and said inverting MOSFET transistor; and a high impedance circuit connected to a source of the noninverting input transistor and a source of the inverting input transistor;

wherein said noninverting MOSFET transistor and said inverting MOSFET transistor are depletion-type MOSFETs, and wherein the high impedance circuit includes a constant current transistor formed of a MOSFET in which a bias voltage is applied to a gate thereof and means for switching levels of said bias voltage applied to the gate of the constant current transistor so as to eliminate the through current, and wherein said means for switching includes:
an inverter;
a first transistor including a gate for receiving a bias voltage switching signal and a drain connected to the gate of the constant current transistor; and a second transistor and a third transistor forming an analog switch, drains of the second and third transistors being connected to the gate of the constant current transistor, sources of the second and third transistors receiving the bias voltage, a gate of the second transistor receiving the bias voltage switching signal, and a gate of the third transistor receiving the bias voltage switching signal through the inverter.

8. The differential amplifier according to claim 7, wherein said noninverting MOSFET transistor and said inverting MOSFET transistor are P-channel transistors.

9. The differential amplifier according to claim 7, wherein said noninverting MOSFET transistor and said inverting MOSFET transistor are n-channel transistors.

10. The differential amplifier according to claim 7, further comprising an output buffer circuit for buffering said output voltage.

11. A differential amplifier, comprising:
a noninverting input transistor including a gate for receiving a first input signal;
an inverting input transistor including a gate for receiving a second input signal; and
an output buffer section which includes:
an output transistor formed of a MOSFET having a gate connected to a drain of one of the noninverting input transistor and the inverting input transistor and a source connected to a first power source; and
an output constant current transistor formed of a MOSFET having a drain connected to a drain of the output transistor, a source connected to a second power source, and a gate supplied with a constant bias voltage;
said noninverting input transistor and said inverting input transistor being configured whereby a difference between the first input signal and the second input signal is amplified; and
wherein the noninverting input transistor and the inverting input transistor are each formed of a depletion-type MOSFET.

12. A differential amplifier according to claim 11, further comprising a high impedance circuit connected to a source of the noninverting input transistor and a source of the inverting input transistor, wherein the high impedance circuit includes a constant current transistor formed of a MOSFET in which a bias voltage is applied to a gate thereof, the constant current transistor being formed of a depletion-type MOSFET.

13. A differential amplifier according to claim 12, wherein the output constant current transistor is formed of a depletion-type MOSFET.

14. A differential amplifier according to claim 11, wherein the output constant current transistor is formed of a depletion-type MOSFET.

15. A differential amplifier, comprising:
a noninverting MOSFET transistor and an inverting MOSFET transistor configured as a differential pair for producing an output voltage as a function of respective input signals applied to said noninverting MOSFET transistor and said inverting MOSFET transistor; and
an output buffer section which includes:
an output transistor formed of a MOSFET having a gate connected to a drain of one of the noninverting input transistor and the inverting input transistor and a source connected to a first power source; and an output constant current transistor formed of a MOSFET having a drain connected to a drain of the output transistor, a source connected to a second power source, and a gate supplied with a constant bias voltage;

wherein said noninverting MOSFET transistor and said inverting MOSFET transistor are depletion-type MOSFETs.

16. The differential amplifier according to claim 15, wherein said noninverting MOSFET transistor and said inverting MOSFET transistor are P-channel transistors.

17. The differential amplifier according to claim 15, wherein said noninverting MOSFET transistor and said inverting MOSFET transistor are n-channel transistors.

18. The differential amplifier according to claim 15, further comprising constant current means for controlling a current through said non-inverting MOSFET transistor and said inverting MOSFET transistor.

19. The differential amplifier according to claim 18, further comprising means for disabling said constant current means to block current through said noninverting MOSFET transistor and said inverting MOSFET transistor during non-operation of said differential amplifier.

* * * * *